United States Patent
Hardison et al.

(10) Patent No.: US 7,988,415 B2
(45) Date of Patent: Aug. 2, 2011

(54) LIGHTNING PROTECTION FOR WIND TURBINES

(75) Inventors: Richard Allen Hardison, Greenville, SC (US); Steven Haines Olson, Greer, SC (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 12/872,198

(22) Filed: Aug. 31, 2010

(65) Prior Publication Data

US 2011/0142643 A1    Jun. 16, 2011

(51) Int. Cl.
*F03D 11/00* (2006.01)
(52) U.S. Cl. ................ 416/61; 416/146 R
(58) Field of Classification Search ............... None
See application file for complete search history.

(56) References Cited

U.S. PATENT DOCUMENTS

| | | | |
|---|---|---|---|
| 4,522,889 A | 6/1985 | Ebneth et al. | |
| 6,457,943 B1 | 10/2002 | Olsen et al. | |
| 6,612,810 B1 | 9/2003 | Olsen et al. | |
| 7,040,864 B2 | 5/2006 | Johansen et al. | |
| 7,120,004 B2 | 10/2006 | Hall | |
| 7,186,086 B2 | 3/2007 | Yoshida | |
| 2008/0095624 A1* | 4/2008 | Lewke | 416/146 R |
| 2008/0193292 A1 | 8/2008 | Stam et al. | |
| 2009/0038819 A1* | 2/2009 | Molbech | 174/2 |
| 2009/0139739 A1 | 6/2009 | Hansen | |
| 2009/0196751 A1 | 8/2009 | Jacobsen et al. | |
| 2009/0246025 A1 | 10/2009 | Lewke et al. | |
| 2010/0047074 A1 | 2/2010 | Hernandez et al. | |

FOREIGN PATENT DOCUMENTS

DE    102005017865 A1 * 11/2006

OTHER PUBLICATIONS

DE 10 2005 017 865 A1 Machine Translation. Accessed EPO website Mar. 8, 2011.*

* cited by examiner

*Primary Examiner* — Richard Edgar
(74) *Attorney, Agent, or Firm* — James W. Pemrick; Ernest G. Cusick; Frank A. Landgraff

(57) ABSTRACT

A rotor blade for a wind turbine is provided. The rotor blade includes a rotor blade body, at least one receptor adapted to be a location for lightning impact, and at least one down conductor connected to the receptor and located within the rotor blade body. The down conductor includes a first conductor connected to the receptor and a ground connection of the wind turbine, and a second insulated conductor connected to the receptor and a non-grounded location of the wind turbine. A path is formed from the ground connection of the first conductor to the non-grounded location of the second insulated conductor. This path facilitates a continuity test used to evaluate a condition of the lightning protection system.

15 Claims, 3 Drawing Sheets

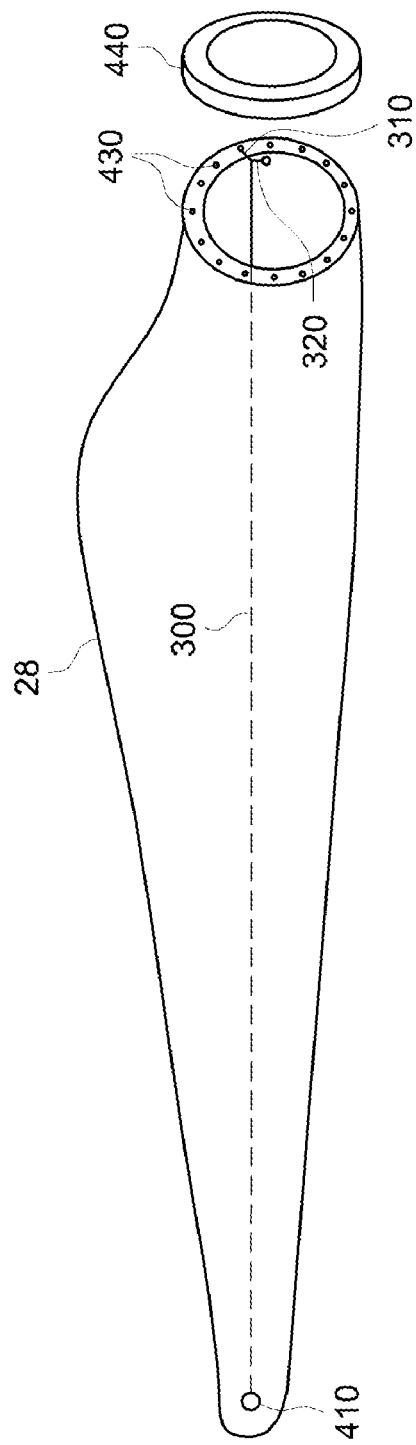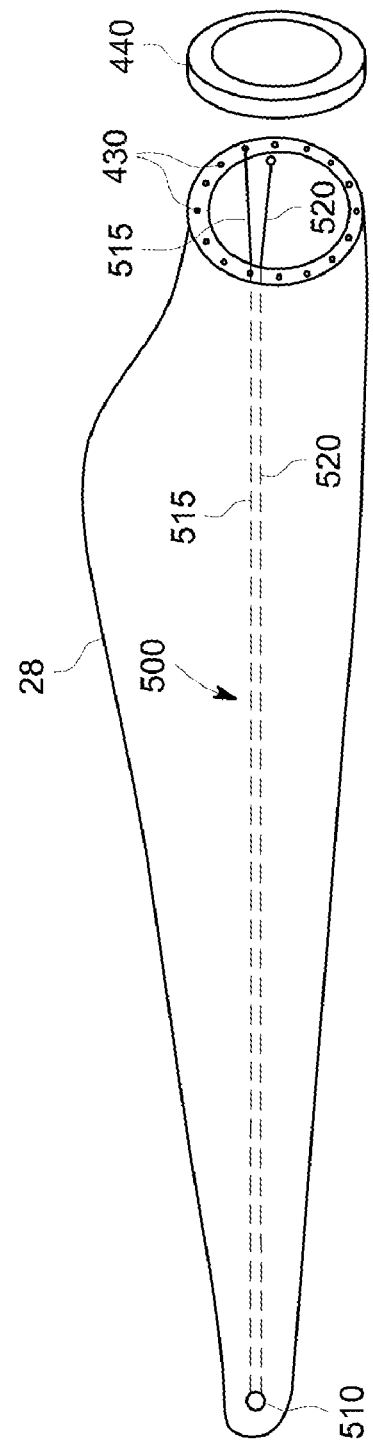

US 7,988,415 B2

LIGHTNING PROTECTION FOR WIND TURBINES

BACKGROUND OF THE INVENTION

The present invention relates to lightning protection for wind turbines. More particularly, the invention relates to lightning protection for wind turbines and lightning protecting for rotor blades of wind turbines. Specifically, the invention relates to a rotor blade, a lightning protection system, and a method of manufacturing a rotor blade.

Damage to wind turbines due to lightning strikes has been recognized as an increasing problem. The influence of lightning faults on the reliability of wind turbines and wind farms may become a concern as the capacity of wind turbines increases. This is particularly the case when several large wind turbines are operated together in wind farm installations because the potential loss of multiple large production units due to one lightning strike may be significant. Unlike other electrical installations such as overhead lines and power plants, it is more difficult for wind turbines to provide protective conductors that can be arranged around or above the wind turbine. This is due to the physical size and nature of wind turbines. Wind turbines typically have two or three blades with a diameter of several tens of meters up to 100 m or more. The rotor rotates high above the ground. In addition, there is extensive use of insulating composite materials, such as glass fiber reinforced plastic, as load-carrying parts. Aerodynamic considerations and consideration of the fast rotating blades also have to be taken into account for a lightning protection system.

The lightning conduction system of a typical wind turbine blade consists of one or more metallic receptor(s) connected to a down conductor that carries the strike from the receptor(s) to the blade bearing and eventually through the tower to the ground. Lightning is striking the blades and is primarily not noticeable unless there is external damage. However the internal connections of the down conductor may be damaged and are not easily found unless they are checked for continuity by comparing the ohm response between the receptor(s) and the tower or ground. To access the blade tip receptor it requires a crane or expensive man basket apparatus. This testing process is labor intensive, difficult and costly, and can only be performed as the weather permits.

BRIEF DESCRIPTION OF THE INVENTION

In view of the above, according to one aspect of the present invention, a rotor blade for a wind turbine is provided. The rotor blade includes a rotor blade body, at least one receptor adapted to be a location for lightning impact, and at least one down conductor connected to the receptor and located within the rotor blade body. The down conductor includes a first conductor connected to the receptor and a ground connection of the wind turbine, and a second insulated conductor connected to the receptor and a non-grounded location of the wind turbine. A path is formed from the ground connection of the first conductor to the non-grounded location of the second insulated conductor. This path facilitates a continuity test used to evaluate a condition of the lightning protection system.

According to another aspect of the present invention, a lightning protection system for a wind turbine is provided. The wind turbine includes a nacelle, a hub and one or more rotor blades. Each rotor blade includes a rotor blade body, at least one receptor adapted to be a location for lightning impact, and at least one down conductor connected to the receptor and located within the rotor blade body. The down conductor includes a first conductor connected to the receptor and a ground connection of the wind turbine, and a second insulated conductor connected to the receptor and a non-grounded location of the wind turbine. A path is formed from the ground connection of the first conductor to the non-grounded location of the second insulated conductor. This path facilitates a continuity test used to evaluate a condition of the lightning protection system.

According to yet another aspect of the present invention, a wind turbine is provided having a lightning protection system and one or more rotor blades. The wind turbine includes at least one rotor blade body and at least one receptor in the at least one rotor blade body, where the at least one receptor is adapted to be a location for lightning impact. At least one down conductor is connected to the at least one receptor, and located in the at least one rotor blade body. The down conductor includes a first conductor connected to the at least one receptor and a ground connection of the wind turbine, and a second insulated conductor connected to the at least one receptor and a non-grounded location of the wind turbine. A path is formed from the ground connection of the first conductor to the non-grounded location of the second insulated conductor. This path facilitates a continuity test used to evaluate a condition of the lightning protection system.

Further embodiments refer to wind turbines including rotor blades and lightning protection systems described herein.

BRIEF DESCRIPTION OF THE DRAWINGS

A full and enabling disclosure of the present invention including the best mode thereof, to one of ordinary skill in the art is set forth more particularly in the remainder of the specification, including reference to the accompanying figures wherein:

FIG. 4 illustrates a schematic drawing of a rotor blade including a rotor blade lightning protection system, according to an aspect of the present invention; and FIG. 5 illustrates a schematic drawing of a rotor blade including a rotor blade lightning protection system, according to an aspect of the present invention;

DETAILED DESCRIPTION OF THE INVENTION

Reference will now be made in detail to the various aspects of the invention, one or more examples of which are illustrated in the figures. Each example is provided by way of explanation of the invention and is not meant as a limitation of the invention. For example, features illustrated or described as part of one aspect can be used on or in conjunction with other aspects to yield yet a further aspect. It is intended that the present invention includes such modifications and variations.

Modern wind turbine blades are structures manufactured of various materials, such as glass reinforced plastic (GRP), wood, wood laminate and carbon reinforced plastic (CRP). Parts and components such as mounting flanges, weights, bearings, wires, and electrical wiring are made of metal. Particularly, for blades constructed entirely from non-conducting materials, lightning attachment points, that is receptors, are mostly found close to the tip or distributed over the blade.

The generic problem of lightning protection of wind turbine blades is to conduct the lightning current safely from the attachment point to the hub. Therefore, the system has to be fully integrated into the different parts of the wind turbine to ensure that all parts likely to be lightning attachment points are able to withstand the impact of the lightning strike.

Figure 1:
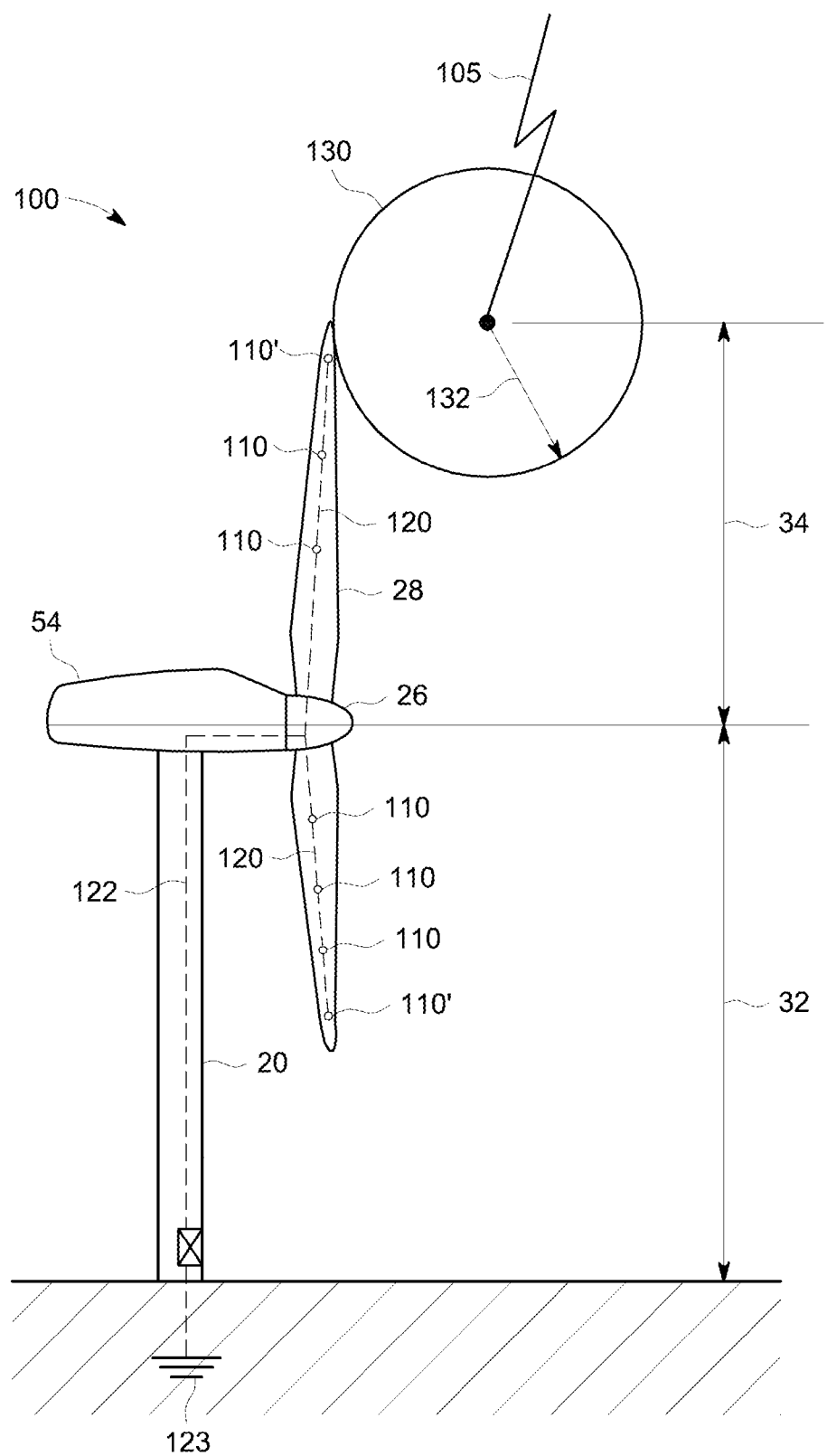
FIG. 1 illustrates a schematic drawing of a wind turbine including a rotor blade lightning protection system, according to an aspect of the present invention.

FIG. 1 illustrates a wind turbine 100 to which the lightning protection system of the present invention can be applied. On top of the tower 20 nacelle 54 is located. The hub 26 is rotatably mounted to the nacelle 54. The hub is further connected to the rotor blades 28. The highest point of incidents of lightning 105 is given by the height 32 of the tower and the length 34 of the blade, which is the radius of the rotor, respectively. In order to be within a predetermined lightning protection safety class, lightning which comes closer than a predetermined distance to a part of the wind turbine needs to be prevented from damaging the installation. The distance of the lightning 105 from the wind turbine distinguishes the different lightning protection safety classes. A general method is the rolling sphere method to determine lightning protection classes. Thereby, a sphere 130 having a radius 132 is virtually rolled over each part of the system to be protected. The area at risk of lightning impact is defined as the sphere with the center being the leader channel of the lightning. The surface of the sphere 130 is considered to be those points from which a discharge may occur.

Different radii are given for different lightning protection classes, e.g. 20 meters for class I. For each surface location a lightning strike has a certain probability. The smaller the radius, the more likely a lightning strike will occur. Protection is provided for each possible position of the sphere 130 with radius 132 rolled over the wind turbine.

For example, in order to be lightning protection safety class 1, lightning must be able to come as close as the sphere 130 with the radius of 20 meters and the wind turbine needs to be protected from lightning with a leader channel coming within a distance such that sphere of points with a possible discharge does not touch the installation. In other words, it is desirable to have a lightning protection system for the wind turbine and components thereof so that the sphere with a radius which corresponds to a distance that would damage the wind turbine or components thereof does not touch the surface of the wind turbine.

Receptors 110, 110' are located on the rotor blades 28. The receptors are connected to down conductor 120 within the blades. Further, an electrical connection is established via the hub 26 and the conductor 122 such that currents from lightning striking the receptors could flow through down conductor 120, conductor 122, which is grounded as indicated by reference 123.

Thereby, lightning protection of the blades 28 is established by providing the receptors 110, 110' at desired locations of incidents of lightning and providing conductors 122 or a conduction path to discharge the lightning strike 105. The principle of this protection system is to provide a preferred path for the lightning.

Thus, the lightning protection system may have discrete lightning receptors 110, 110' placed at or near the blade tip. From the receptors at the tip, an internal down conductor system 120 leads the lightning current to the blade root. According to another aspect, particularly longer blades are equipped with several receptors distributed over the blade. The receptors penetrating the surface may, according to one aspect, be placed in such a way that the likelihood of lightning striking the unprotected part of the blade surface is reduced. The spacing of discrete receptors may, according to another aspect, for example be a spacing where the flashover voltage along the blade surface is smaller than the breakdown voltage of the blade skin. As an example, solid conductors may according to one embodiment be placed on the surface with spacing ranging from 30 cm to 60 cm.

However, locations at which lightning 105 strikes the wind turbine 100 or components thereof are given by a local electrical field. Damage to wind turbines, which have been previously reported, showed that in some instances lightning strikes the down conductor or receptor directly, particularly to the trailing edge of rotor blade. Lightning strikes to non-conducting blade portions may at least partly be explained by the fact that water makes blades more conductive. Another factor can be that blades 28 may simply be in the way of lightning striking the wind turbine 100. In addition, it is known that discharges develop along a surface more easily than through air.

When lightning strikes the down conductor 120 directly through a nonconductive part of the rotor blade 28, for example, the trailing edge of blade, damage to the GRP of the rotor blade may occur due to surface carbonization of the glass fibers, punctures and delamination. This damage can deteriorate the functionality and/or lifetime of the rotor blade and further may provide a preferred path for a second and further strike of lightning.

Severe damage to wind turbine blades 28 is caused when lightning forms arcs inside the blade. The arcs may form in the air filled cavities inside the blade or along the inner surfaces. The pressure shock wave caused by such internal arcs may destroy the blade surface skins. Internal arcs often form between the lightning attachment point at the tip of the blade and some conducting component internal to the blade. Another type of damage occurs when the lightning current or part of it is conducted in or between layers of composite materials, presumably because such layers hold some moisture.

According to aspects described herein, the electrical field strength around the down conductor 120, which determines whether lightning strikes the down conductor directly, may be reduced by providing an insulation sheet around the down conductor.

Thereby, the down conductor element 120, 122 may be provided in form of a first insulated cable or a woven aluminum conductor or cable paired with a second insulated wire or conductor. It is understood that covering the first and second conductors with an insulation sheet means that essentially the entire conductor is covered except for those parts, for example, at which connections to the receptors or termination points are present. According to another aspect, the connections to the receptors 110, 110' can also be insulated with an insulation material. In other aspects the first conductor may not have an insulating coating.

The insulation around the conductors reduces the electrical field strength around the conductors and, therefore, may avoid electrical breakdown. Further, according to another aspect, the insulation around the conductor(s) may homogenize the electrical field around the conductor(s). According to glass-fiber web bonding, which has been commonly used, the electrical field could not be controlled to be homogenous. According to aspects described herein, the insulation around the conductor enables a control of a homogenous electrical field.

A down conductor system may have sufficient cross-section to be able to withstand a direct lightning strike and conduct the full lightning current. According to one embodiment, the minimum cross-section for aluminum may for example be about 50 mm². The down conductor system is connected to receptors on the blade. These conductors mounted on the blade surface may deteriorate the aerodynamics of the blade or generate undesirable noise. For lightning conductors embedded in the blade, wires or braids of, for example, either aluminum or copper can be used. Lightning down conductors may be placed inside the blade. Metallic fixtures for the conductor penetrate the blade surface and serve as discrete lightning receptors. The materials used for lightning protection of wind turbine blades shall be able to withstand the electric, thermal and electrodynamic stresses imposed by the lightning current.

Figure 2:
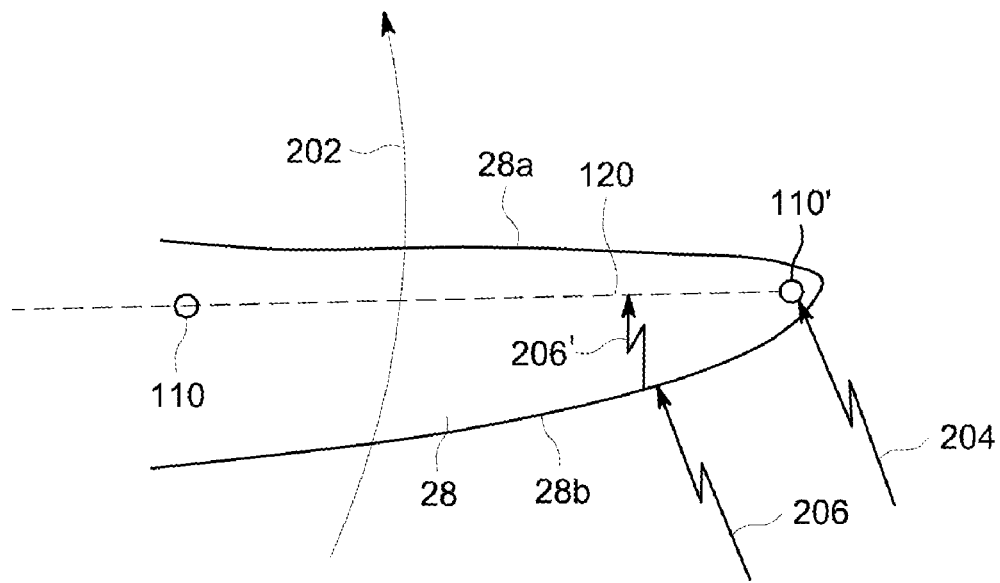
FIG. 2 illustrates a part of a rotor blade including receptors and a down conductor in a rotor blade, according to an aspect of the present invention.

FIG. 2 illustrates a portion of rotor blade 28. The rotating direction is illustrated by arrow 202. The rotor blade 28 has a leading edge 28a and trailing edge 28b. The rotor blade 28 includes receptor 110' at the tip of the rotor blade and receptor 110 within the rotor blade. The receptors 110, 110' are connected by down conductor 120.

For commonly used lightning protection systems the following situations have been observed. One the one hand, there are lightning strikes 204 to one of the receptors and the charge is discharged via the down conductor 120. On the other hand, there might also be lightning strikes 206, 206' which penetrate the rotor blade 28, wherein the down conductor 120 is struck directly by lightning. Thereby, the above-mentioned damages occur. In the latter case the internal connections or integrity of the down conductor may be damaged or compromised. It has been very difficult to identify and locate this internal damage to the down conductor.

Figure 3:
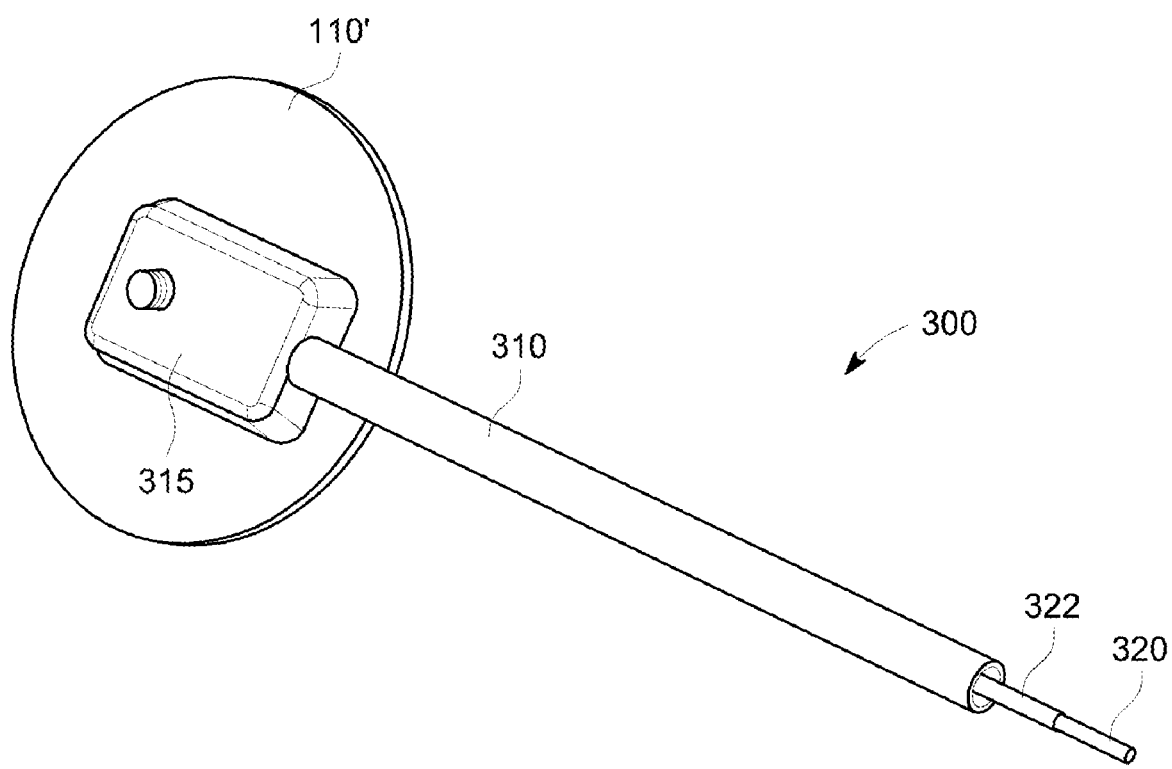
FIG. 3 illustrates a portion of a down conductor connected to a receptor, according to an aspect of the present invention.

FIG. 3 illustrates a portion of a down conductor 300 according to an aspect of the present invention. This design utilizes a woven aluminum strip down conductor as a first conductor 310, and places a second insulated wire or conductor 320 down the middle of the first conductor 310. The second conductor may have an insulating coating 322. Both conductors 310 and 320 are connected to the receptor(s) 110, 110' at the blade tip (and/or other locations) via connector 315. The first conductor 310 is also connected to a ground connection. The ground connection may be the pitch bearing, blade bearing or a blade bolt located at the root section of the blade. This ground connection is configured to have a low resistance path to ground 123.

The second insulated conductor 320 is not connected to the ground near the root of the blade, but rather may be crimped and attached to an internal wall or surface near the blade bearing or root of the blade so that it will not act as a grounding path. During inspection of the lightning protection system, it is then a simple matter for a technician to use an ohmmeter directly on the second insulated conductor 320 and the blade root bearing (or other grounding point) to check the system and down conductor continuity. If some part of the receptor connection or down conductor cable 300 were damaged, the reading would indicate a problem. If the lightning protection system or down conductor is damaged, the resistance of the conduction path will have a value that indicates a problem. As one non-limiting example only, if a lightning strike severed the outer conductor 310 the resistance of the down conductor would be higher than desired.

FIG. 4 illustrates a side view of a rotor blade or rotor blade body 28 according to an aspect of the present invention. The rotor blade or rotor blade body 28 includes at least one receptor 410 that is connected to a down conductor 300. The first conductor 310 runs down the length of the blade 28 and may be attached to one of the bolts 430 at the root of blade 28 which is attached to the hub at the pitch bearing 440. When the blade 28 is bolted into place on the pitch bearing 440, this provides a conduction path through the steel tower or grounding cables 122 into ground 123. The second or inner conductor 320 is not connected to ground, and left un-grounded and located on an internal wall of blade 28 near the root. This location allows for access to the second conductor 320 by a maintenance technician.

FIG. 5 illustrates a side view of a rotor blade or rotor blade body 28 according to another aspect of the present invention. The rotor blade 28 includes at least one receptor 510 that is connected to a down conductor 500. The down conductor 500 includes two separate wires that run down the length of the blade 28. A first conductor 515 may be attached to one of the bolts 430 at the root of blade 28 that is attached to the hub at the pitch bearing 440. When the blade 28 is bolted into place on the pitch bearing 440, a conduction path is provided through the steel tower or grounding cables 122 into ground 123. The second conductor 520 is not connected to ground, and left un-grounded and located on an internal wall of blade 28 near the root. This location allows for access to the second conductor 520 by a maintenance technician.

This design will negate the need to approach the blade tip annually for inspection. Also if tip damage is seen or suspected, the lightning grounding system can be checked very quickly and easily, allowing the site manager to make the decision to call in a repair team or not.

A method for manufacturing or assembling a rotor blade for a wind turbine is herein described. The method includes the steps of providing a rotor blade body, providing at least one receptor in the rotor blade body, where the receptor is adapted to be a location for lightning impact. Another step provides at least one down conductor and connecting the down conductor to the receptor. The step of providing the at least one down conductor also includes the steps of providing a first conductor, and connecting the first conductor to the at least one receptor and a ground connection of the wind turbine, and providing a second insulated conductor, and connecting the second insulated conductor to the at least one receptor and a non-grounded location of the wind turbine.

A further step of performing a continuity test by evaluating a path from the ground connection of the first conductor to the non-grounded location of the second insulated conductor, may also be performed. This step can also include obtaining the resistance of the path using an ohmmeter. The resistance can be compared to known values that may indicate proper or improper operation of the down conductor or lightning protection system. In addition, the first conductor and the second insulated conductor may substantially form a co-axial conductor, where the second insulated conductor is located substantially within the first conductor.

The down conductor element may be provided in the form of an insulated cable or wire, or any other suitable conductor. The insulation around parts or all of the down conductor reduces the electrical field strength around the down conductor and may, thereby, avoid electrical breakdown thereto. Further, according to another aspect, the insulation around the down conductor may homogenize the electrical field around the down conductor. According to glass-fiber web bonding which has been commonly used, the electrical field could not be controlled to be homogenous. According to aspects described herein, the insulation sheet around the down conductor enables a control of a homogenous electrical field.

The insulation reduces the risk of lightning strikes directly to the down conductor. Thereby, the desired discharge path along the receptors 310, the conductor 312 to the down conductor, and the down conductor 320 itself has an even higher probability. Accordingly the probability of a lightning strike directly attaching to the down conductor through non-conductive parts of the shell of the rotor blade can be reduced.

According to another aspect, the cross-section of the down conductor may be circular or has at least a minimum radius of curvature of above 2 mm. As compared to rectangular down conductors, a curved down conductor cross-section may further decrease the electrical field, which occurs during lightning strikes, and thereby further reduce the risk of lightning strikes. According to a further embodiment, the electric strength of the insulator has at least an electric strength of 50 kV/mm. Typically, according to another embodiment, the electric strength is above 100 kV/mm. The thickness of the insulation may for example be in the range of 0.5 to 5 mm. According to other embodiments, a multilayer dielectric sheet acting as an isolation of the down conductor can be provided. However, the down conductor and any individual conductors may have any desired cross-sectional shape (e.g., rectangular, oval, polygonal, etc.) as desired in the specific application.

According to further aspects, the down conductor may include copper or aluminum as a material for discharge conducting. Depending on the materials, the area of the cross-section of the down conductor may be at least 30 mm$^2$, 50 mm$^2$, 70 mm$^2$, or even higher. Thereby, it has to be considered that depending on the cross-section and the resistivity corresponding therewith, the temperature of the down conductor may be more or less increased when a lightning strike occurs. On a lightning strike a temperature increase of the down conductor of up to 100° C. or more can be expected. Thus, in combination with the outside temperature, the insulator material may have a resistivity for temperatures of 150° C., 160° C., 180° C., or even higher temperatures. Typically, the temperature resistivity may be a long-term temperature resistivity in order to maintain the durability of the insulation during the entire lifetime of the rotor blade. According to different embodiments, one of the following materials may be used: Ethylene-Chlorinetrifluoreneethylen-Copolymer, Ethylene-Tetrafluoreneethylen-Copolymer, or Polyfluorineethylenepropylene.

According to another embodiment, the down conductor is positioned within the rotor blade 28 such that the down conductor is essentially located along the neutral axis of the rotor blade. During operation of a wind turbine, the rotor blades experience bending due to the wind forces acting upon them. Generally, independent of whether the rotor blade is pre-biased, there is a neutral axis (neutral fiber) or an area with a minimum compression or tension of the rotor blade. The down conductor element is typically positioned along this area with minimum material compression or material tension. For example, this might at least apply for a central portion of the rotor blade. According to another embodiment, the material of the insulation of the down conductor has a Young's modulus of about 10 kN/mm$^2$, 5 kN/mm$^2$ or less. Thereby, the elasticity of the rotor blade is hardly affected by providing an insulation for the down conductor.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A rotor blade for a wind turbine comprising:
    a rotor blade body;
    at least one receptor adapted to be a location for lightning impact;
    at least one down conductor connected to the at least one receptor and located within the rotor blade body, the at least one down conductor comprising:
    a first conductor connected to the at least one receptor and a ground connection of the wind turbine;
    a second insulated conductor connected to the at least one receptor and a non-grounded location of the wind turbine, wherein the second insulated conductor is located substantially within the first conductor;
    wherein, a path is formed from the ground connection of the first conductor to the non-grounded location of the second insulated conductor, the path facilitating a continuity test used to evaluate a condition of the path.

2. The rotor blade of claim 1, wherein the at least one receptor is located near a tip of the rotor blade body.

3. The rotor blade of claim 1, wherein the ground connection of the first conductor comprises one or more of:
    a pitch bearing and a blade root-section bolt.

4. The rotor blade of claim 1, wherein the first conductor is one or more of:
    a copper conductor, an aluminum conductor and a woven aluminum conductor.

5. The rotor blade of claim 1, wherein the first conductor and the second insulated conductor substantially form a co-axial conductor.

6. The rotor blade of claim 1, wherein the non-grounded location of the second insulated conductor is attached to an internal wall of the rotor blade near a pitch bearing.

7. A lightning protection system for a wind turbine, the wind turbine having a nacelle, a hub and one or more rotor blades, the rotor blades comprising:
    a rotor blade body;
    at least one receptor adapted to be a location for lightning impact;
    at least one down conductor connected to the at least one receptor and located within the rotor blade body, the at least one down conductor comprising:
    a first conductor connected to the at least one receptor and a ground connection of the wind turbine;
    a second insulated conductor connected to the at least one receptor and a non-grounded location of the wind turbine, wherein the second insulated conductor is located substantially within the first conductor;
    wherein, a path is formed from the ground connection of the first conductor to the non-grounded location of the second insulated conductor, the path facilitating a continuity test used to evaluate a condition of the lightning protection system.

8. The lightning protection system of claim 7, wherein the at least one receptor is located near a tip of the rotor blade body.

9. The lightning protection system of claim 7, wherein the ground connection of the first conductor comprises one or more of:
    a pitch bearing and a blade root-section bolt.

10. The lightning protection system of claim 7, wherein the first conductor is one or more of:
    a copper conductor, an aluminum conductor and a woven aluminum conductor.

11. The lightning protection system of claim 7, wherein the first conductor and the second insulated conductor substantially form a co-axial conductor.

12. The lightning protection system of claim 7, wherein the non-grounded location of the second insulated conductor is attached to an internal wall of the rotor blade near a pitch bearing.

13. A wind turbine having a lightning protection system and one or more rotor blades, the wind turbine comprising:
   at least one rotor blade body;
   at least one receptor in the at least one rotor blade body, the at least one receptor adapted to be a location for lightning impact;
   at least one down conductor connected to the at least one receptor, the at least one down conductor located in the at least one rotor blade body, wherein the at least one down conductor comprises:
   a first conductor connected to the at least one receptor and a ground connection of the wind turbine;
   a second insulated conductor connected to the at least one receptor and a non-grounded location of the wind turbine; and
   wherein, the first conductor and the second insulated conductor substantially form a co-axial conductor, where the second insulated conductor is located substantially within the first conductor, and a path is formed from the ground connection of the first conductor to the non-grounded location of the second insulated conductor, the path facilitating a continuity test used to evaluate a condition of the lightning protection system.

14. The wind turbine of claim 13, wherein the at least one receptor is located near a tip of the rotor blade body.

15. The wind turbine of claim 13, wherein the ground connection of the first conductor comprises one or more of:
   a pitch bearing and a blade root-section bolt.

* * * * *